United States Patent [19]

Ingraham

[11] Patent Number: 4,831,279
[45] Date of Patent: May 16, 1989

[54] CAPACITY RESPONSIVE CONTROL CIRCUIT

[75] Inventor: Ronald D. Ingraham, Quincy, Mich.

[73] Assignee: Nartron Corporation, Reed City, Mich.

[21] Appl. No.: 148,878

[22] Filed: Jan. 27, 1988

Related U.S. Application Data

[63] Continuation-in-part of Ser. No. 913,084, Sep. 29, 1986.

[51] Int. Cl.⁴ .................. H01H 35/00; G08B 13/26
[52] U.S. Cl. ................................ 307/116; 307/117; 340/562; 361/181
[58] Field of Search ............ 307/116, 117; 340/562; 361/181

[56] References Cited

U.S. PATENT DOCUMENTS

| | | | |
|---|---|---|---|
| 3,549,909 | 12/1970 | Adelson et al. | 307/252 |
| 3,641,410 | 2/1972 | Vogelsberg | 318/345 |
| 3,651,391 | 3/1972 | Vogelsberg | 318/446 |
| 3,666,988 | 5/1972 | Bellis | 307/116 X |
| 3,899,713 | 8/1975 | Barkan et al. | 315/34 |
| 3,919,596 | 11/1975 | Bellis | 307/308 X |
| 3,927,336 | 12/1975 | Carlson et al. | 307/116 X |
| 3,965,465 | 6/1976 | Alexander | 307/125 X |
| 3,984,757 | 10/1976 | Gott et al. | 323/19 |
| 4,016,453 | 4/1977 | Moennig | 307/308 X |
| 4,031,408 | 6/1977 | Holz | 307/116 |
| 4,101,805 | 7/1978 | Stone | 315/74 |
| 4,119,864 | 10/1978 | Petrizio | 307/116 |
| 4,152,629 | 5/1979 | Raupp | 315/362 |
| 4,159,473 | 6/1979 | Senk | 307/116 X |
| 4,210,822 | 7/1980 | Wern | 307/116 |
| 4,211,959 | 7/1980 | Deavenport et al. | 315/362 |
| 4,213,061 | 7/1980 | Conner | 307/116 |
| 4,246,533 | 1/1981 | Chiang | 307/116 X |
| 4,264,831 | 4/1981 | Wern | 307/252 |
| 4,289,972 | 9/1981 | Wern | 307/116 |
| 4,289,980 | 9/1981 | McLaughlin | 307/308 |
| 4,308,443 | 12/1981 | Tucker et al. | 307/116 X |
| 4,323,829 | 4/1982 | Witney et al. | 307/116 X |
| 4,360,737 | 11/1982 | Leopold | 307/116 |
| 4,414,541 | 11/1983 | Ho | 307/117 X |
| 4,636,774 | 1/1987 | Galvin et al. | 307/117 |
| 4,760,490 | 7/1988 | Murao | 361/181 |

Primary Examiner—William M. Shoop, Jr.
Assistant Examiner—Sharon D. Logan
Attorney, Agent, or Firm—Price, Heneveld, Cooper, DeWitt & Litton

[57] ABSTRACT

A capacitive detecting circuit for detecting transient capacitive changes such as that of a person moving into proximity of a sensing element. A sensing element is coupled to a threshold level controlled amplifier supplied with relatively high frequency signals from an oscillator through a high input impedance. A detector circuit is coupled to the amplifier output to detect D.C. variations in the level control loop caused by transient capacitive changes and provide a control output signal representative of such change.

17 Claims, 1 Drawing Sheet

CAPACITY RESPONSIVE CONTROL CIRCUIT

The present application is a continuation-in-part application of pending application Ser. No. 06/913,084 filed Sept. 29, 1986 entitled "Touch Control Switch Circuit" to Ingraham. The subject matter of this prior application is incorporated herein by reference.

BACKGROUND OF THE INVENTION

The present invention relates to an electrical circuit and particularly to a capacity responsive electrical switching circuit.

There exists a variety of electrical switching circuits which respond to a persons touch on a touch pad or other detecting element. The touch pad can be in the form of a lamp base or a specific surface area of an electrical appliance or device to be actuated. Such circuits represent a convenient manner by which a consumer can easily operate such devices, without the need for manually actuating a conventional toggle, push-button or other type switch. Touch control electrical switching circuits have been increasingly popular; for example, in use in controlling table lamps, floor lamps, and the like, although they have other applications as well. U.S. Pat. Nos. 4,119,864 and 4,360,737 are representative of existing touch control switch circuits. Typically, such circuits employ the human body as an antenna for picking up 60 hertz radiation existing in the environment by virtue of the line frequency power in the building and utilize the induced voltage as a trigger signal for controlling the touch controlled electrical circuit. Such systems, however, can suffer from erratic operation due to variations in the nature of the ambient 60 hertz field and the physiological make-up of the person utilizing the system.

Significant improvements to these systems are represented by the above identified parent application and U.S. patent application Ser. No. 07/038,832, filed Apr. 15, 1987 entitled DC TOUCH CONTROL SWITCH CIRCUIT. The sensitivity of these circuits are particularly well suited for direct touch control of the touching plate. If proximity is to be detected, changes in ambient capacitance, as well as other environmental factors such as temperature, can be troublesome and cause unreliable operation. The system of the present invention improves upon such circuits by providing a system having even greater sensitivity such that actual touching of the sensing element is not necessary to actuate the device which can, therefore, be employed for proximity detection such as used in connection with, for example, burglar alarms and the like. The system of the present invention thus, provides improved sensitivity and yet a system which minimizes erratic operation due to environmental factors.

SUMMARY OF THE PRESENT INVENTION

The system of the present invention includes a sensing element which may be in the form of a touch plate, a loop antenna, or other physical device positioned to be either touched or be closely proximate to an individual actuating the present circuit. The sensing element is coupled to the input of an amplifier which also receives signals from a relatively high frequency oscillator through a high input impedance. An automatic threshold level control circuit is coupled to the amplifier and a D.C. detector circuit is coupled to the amplifier output to provide a steady state D.C. output signal when no one is near the sensing element. The touching or proximity of a person's body capacity to the sensing element lowers the relatively high frequency signal applied to the input amplifier causing a momentary change in the detected D.C. output, voltage as the automatic level control circuit attempts to reestablish a quiescent value. This momentary change in the output D.C. level is applied to a switching circuit to provide an alarm control output signal in the preferred embodiment. In the preferred embodiment, the alarm can be, for example, a burglar alarm or the like to provide an audible alarm signal which is either instantaneous or delayed as desired.

These and other features, objects, and advantages of the present invention will become apparent upon reading the following description thereof together with reference to the accompanying drawing figure in which:

DETAILED DESCRIPTION OF THE PREFERRED EMBODIMENT

Figure 1:
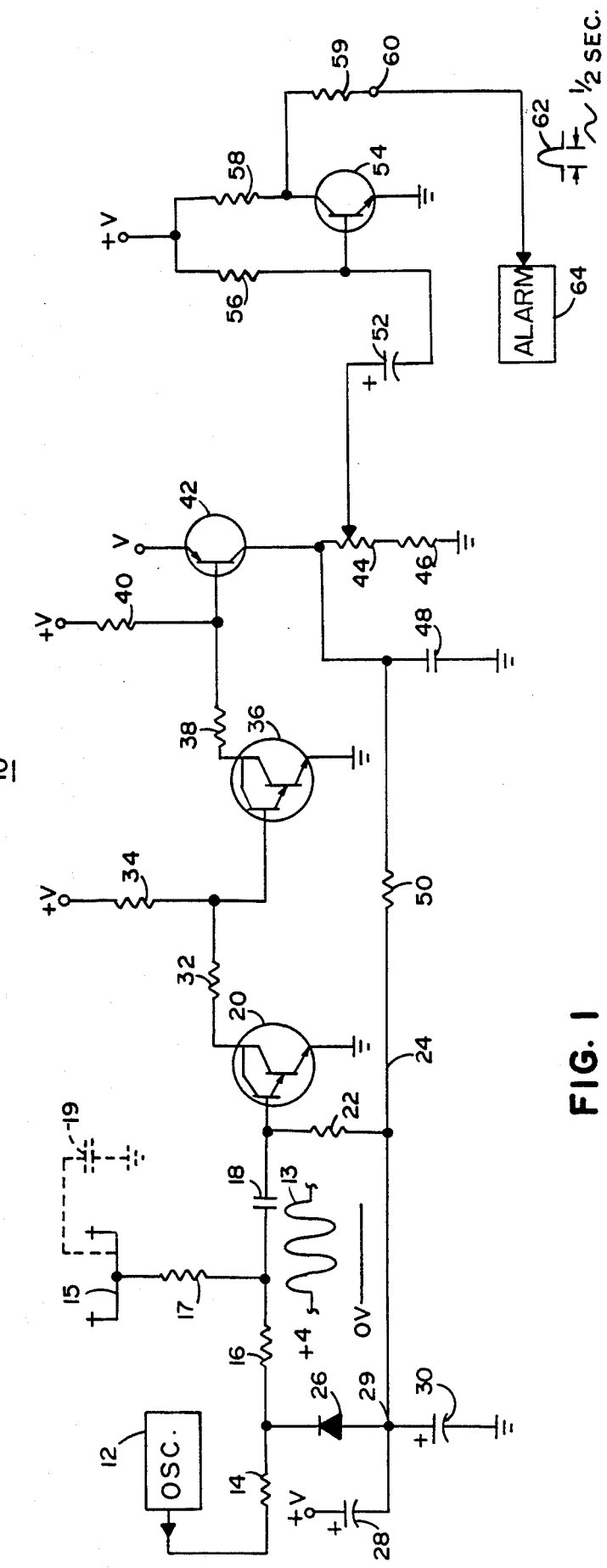
FIG. 1 is an electrical circuit diagram in block and schematic form of the circuit of the present invention.

In FIG. 1, the capacity sensitive control circuit 10 is shown and includes an oscillator 12 which is a Colpitts oscillator with circuit components to provide a 50 kilohertz output signal. The frequency is selected to provide a high enough frequency to respond to a person's body capacity ranging in the order of from 40 to 300 picofarads and yet not sufficiently high to provide electromagnetic interference to surrounding electronic equipment such as radios, televisions, and the like. The sinusoidal output signal of the oscillator 12 is applied to the input of a high impedance circuit constituting a 4.7 megohm resistor 16 by a 100 kilo-ohm resistor 14. A 22 picofarad capacitor 18 minimizes 60 hertz signal interference and couples the relatively high frequency A.C. signals from oscillator 12 to the base of a Darlington amplifier 20 having its emitter coupled to ground. A sensing element 15 is coupled to the junction of resistor 1 and capacitor 18 through a current limiting resistor 17 which in the preferred embodiment was a 100 kilo-ohm resistor employed to prevent static discharge from damaging the transistor amplifier 20. The base terminal of amplifier 20 is coupled to the automatic level control (A.L.C) loop conductor 24 through a 15 megohm resistor 22. Conductor 24 provides the A.L.C. control signal to the base of amplifier 20 as described below.

A clamping circuit in the feedback loop limits the compensation range but allows a lower output signal to establish a quiescent operating level. The clamping circuit and A.L.C. control diode 26, having its cathode coupled to the junction of resistors 14 and 16. The anode of diode 26 is coupled to conductor 24 at the junction 29 of a first 10 microfarad capacitor 28 and a second 22 microfarad capacitor 30. Capacitor 28 has its junction remote from capacitor 30 coupled to a +V supply which in the preferred embodiment was a 9 volt battery while the terminal of capacitor 30 remote from the junction with capacitor 28 is coupled to system ground which is the negative terminal of the 9 volt battery. During operation, the junction 29 initializes at approximately +3 D.C. volts level which clamps the level of the 50 kilohertz signals applied to resistor 16 from oscillator 12 to approximately +9 volts peak-to-peak. The operation of the A.L.C. loop and the sensing circuit are described in greater detail below following the description of the remaining circuit components.

The collector of amplifier 20 is coupled to +V by its collector resistor 32 and a resistor 34 with the junction of resistors 32 and 34 coupled to the base of a second Darlington amplifier 36 having its emitter coupled to system ground. The collector of transistor 36 is also coupled to +V through a first resistor 38 and a second resistor 40, the junction of which is coupled to the detector comprising a PNP transistor 42 having its emitter coupled to +V and its collector coupled to ground through a 100 kilo-ohm potentiometer 44, constituting a sensitivity adjustment resistor, and a series coupled 33 kilo-ohm resistor 46. The collector is also coupled to a 0.1 microfarad filter capacitor 48 having its terminal remote from transistor 42 coupled to ground. This junction of filter capacitor 48 and the collector of transistor 42 is coupled to node 29 via the A.L.C. feedback resistor 50 comprising a 100 kilo-ohm resistor.

The wiper arm of potentiometer 44 is coupled to a 10 microfarad coupling capacitor 52 for applying time varying signals to the base terminal of an NPN switching transistor 54 coupled also to +V through a base biasing resistor 56. The collector of transistor 54 is coupled to +V through a resistor 58 and its emitter coupled to ground. The collector terminal is also coupled to an output terminal 60 of the circuit by a 1 megohm output resistor 59. The output terminal 60 provides a positive going pulse of approximately one half to one second duration when the sensing element 15 is touched or a person comes sufficiently close to cause activation of the system. This output signal shown as a waveform element 62 in the figure is applied to the input terminal of an alarm circuit 64 which responds thereto to provide either a delayed alarm or an instantaneous alarm as desired.

In the preferred embodiment of the invention, the touch control circuit was used in connection with a portable burglar alarm containing its own battery with a circuit and alarm system encased in a small package including a loop 15 constituting the sensing element. The loop can be hung over a door knob, for example, and upon touching the door knob on the other side of the door, or upon close proximity by reaching for the knob, the signal applied to the gain controlled amplifier decreases sufficiently to cause the switching transistor 54 to change from its normally conductive state and provide the output pulse 62 for providing the alarm. In the preferred embodiment, the alarm circuit 64 can be programmed by a switch to provide either an instantaneous alarm upon receipt of the pulse 62 or allow a 15 second delay for the owner of the building to enter through the door and deactivate the alarm before it is sounded. The alarm circuit 64 includes an acoustical transducer sufficient to provide an audible alarm adequate for functioning as a burglar alarm. Circuit 64 can be of conventional design with respect to this aspect of the overall system. The system operates to provide a highly sensitive detection of the body capacitance represented by the phantom line capacitor 19 shown in FIG. 1 in the following manner.

Upon application of the D.C. power, junction 29 goes to approximately a D.C. 4 volt level which when applied to the base of transistor 20 through resistor 22 biases the transistor amplifier in a linear operating mode. The pulses from oscillator 12, shown by waveform 13, are superposed on the D.C. bias level and are applied through resistor 16 and capacitor 18 to the base of amplifier 20 and amplified by amplifier 20 and again by amplifier 36 and applied to the base of detector transistor 42. Transistor 42 is biased to conduct only on the negative half cycles of the applied input voltage to provide a D.C. level across capacitor 48 which reaches an equilibrium with the voltage at node 29 to establish a quiescent operating state for the system. The steady state D.C. voltage at the wiper arm of resistor 44 is blocked by capacitor 52. The amplified pulses through transistor 42 are filtered to steady-state D.C. by capacitor 48. The sensitivity adjustment potentiometer 44 is adjusted such that the negative signal applied through capacitor 52 when superposed upon the D.C. signal applied through biasing resistor 56 is sufficient to render transistor 54 non-conductive, thereby providing a high-level output signal at output terminal 60 through resistor 59. The response time of the A.L.C. loop is determined by the time constant established by resistors 50 and capacitors 28 and 30 and is selected to be approximately one half to one second such that proximity to or touching of the sensing element 15, as represented by the presence by capacitor 19 for a similar time period, will provide a pulse signal detectable by the negative feedback amplifier circuit including transistors 20, 36, and 42 before the automatic level control again reaches a quiescent state.

Thus, upon the momentary touching of either a loop antenna, represented by sensing element 15, or a touch plate, the A.C. signal applied to the base of transistor 20 is effectively reduced by shunting a portion of the 50 kilohertz signal to ground. The signal at the base of transistor 42 is subsequently reduced in amplitude which, therefore, momentarily reduces the D.C. voltage level at the wiper arm of potentiometer 44. This negative going, varying D.C. signal is applied through capacitor 52 to transistor 54 turning transistor 54 momentarily off. Transistor 54 remains off for a period of about one half second, corresponding to the A.L.C. time constant, while the A.L.C. circuit establishes equilibrium. When transistor 54 turns off, it provides an output pulse 62 having a similar pulse width which is applied to the alarm circuit 64. Circuit 64 responds in a conventional fashion to the trigger impulse to initiate the alarm actuation sequence either instantly or upon delayed sequence as desired.

With the system of the present invention, therefore, a relatively highly sensitive system can be provided by providing a relatively high gain amplifier having an input terminal sensitive to body capacitance added to the system. The absolute value of the capacitance applied in the high impedance system is compensated for by the negative feedback in the A.L.C. loop such that only transient signals provide a triggering output pulse. As a result steady state or slowly varying capacitive effects of the environment will not provide an output signal and therefore the circuit has relatively wide applications particularly where only transient capacitance such as momentary touching or proximity of a conductive body are desired to be detected. The system can be used for a wide variety of applications other than that of the preferred embodiment described.

It will become apparent to those skilled in the art the various modifications to the preferred embodiment of the invention and its application as described herein can be made without departing from the spirit or scope thereof as defined by the appended claims.

The embodiments of the invention in which an exclusive property of privilege is claimed are defined as follows:

1. A capacity responsive circuit for providing a control output signal in response to a person's proximity to a sensing element comprising:

an oscillator for providing periodic output signals therefrom;

a relatively high impedance element coupled to said oscillator;

an amplifier circuit having an input coupled to the output of said oscillator through said relatively high input impedance and an output terminal, said amplifier including an automatic level control circuit having a selected response time for controlling the switching threshold of said amplifier to a predetermined level;

switch circuit coupled to said amplifier output and responsive to changes in the output signals therefrom for changing state;

a sensing element coupled to the input of said amplifier circuit for coupling a body's capacitance t said amplifier input for varying the signal voltage applied to said amplifier from said oscillator and affecting a change in output state of said switch circuit in response to transient body capacitance coupled to said sensing element for a time period generally corresponding to the response time of said automatic level control circuit; and an initializing circuit coupled between said oscillator and said amplifier circuit for establishing an initial D.C. voltage level for said automatic level control circuit.

2. The circuit as defined in claim 1 and further including a detector circuit extending between said amplifier and said switch circuit.

3. The circuit as defined in claim 1 wherein said detector circuit includes a first transistor and further including a potentiometer coupled in series with the emitter-to-collector current path of said first transistor, wherein said potentiometer provides a sensitivity adjustment and wherein the adjustment arm of said potentiometer is A.C. coupled to a control input terminal of said switch circuit.

4. The circuit as defined in claim 3 wherein said switch circuit comprises a solid state switch.

5. The circuit as defined in claim 4 wherein said solid state switch comprises a second transistor having a base terminal coupled to the wiper arm of said potentiometer by means of a coupling capacitor.

6. The circuit as defined in claim 5 wherein said sensing element comprises a loop of wire coupled to the input of said amplifier circuit.

7. The circuit as defined in claim 6 wherein said automatic level control circuit includes a pair of serially coupled capacitors coupled between a source of D.C. operating power and system ground and the junction of said capacitors is coupled to the input of said amplifier and to a current feedback resistor having its terminal remote from said junction coupled to the junction of said potentiometer with said first transistor.

8. The circuit as defined in claim 7 wherein said oscillator provides an output frequency of about 50 kilohertz.

9. The circuit as defined in claim 1 and further including an alarm circuit coupled to said switch circuit for receiving control signals therefrom for actuating said alarm in response to the proximity of a body capacitance to said sensing element.

10. A capacitive sensitive circuit for providing a control output signal in response to a change in capacity at a sensing element comprising:

an oscillator for providing periodic output signals therefrom;

a threshold level controlled amplifier circuit having an input coupled to the output of said oscillator by a relatively high impedance and an output terminal for providing output signals thereat;

a detector circuit coupled to said amplifier for establishing a quiescent D.C. voltage level corresponding to a steady state environmental capacity field; and a sensing element coupled to the input of said amplifier circuit for coupling a capacitance to be detected to said amplifier input for momentarily lowering the D.C. voltage level in response to a transient capacitance coupled to said sensing element;

a switch circuit coupled to said detector and responsive to changes in the D.C. voltage level therefrom to provide a control output signal representative of a detected change in capacity at said sensing element; and a clamping circuit coupled between said oscillator and said amplifier circuit for initializing a predetermined D.C. voltage level for said level controlled amplifier.

11. The circuit as defined in claim 10 wherein said detector circuit includes a first transistor and further including a potentiometer coupled in series with the emitter-to-collector current path of said first transistor wherein said potentiometer provides a sensitivity adjustment and wherein the adjustment arm of said potentiometer is coupled to a control input terminal of said switch circuit.

12. The circuit as defined in claim 11 wherein said switch circuit comprises a solid state switch 13. The circuit as defined in claim 12 wherein said sensing element comprises a loop of wire.

14. The circuit as defined in claim 13 wherein said oscillator provides an output frequency of about 50 kilohertz.

15. The circuit as defined in claim 14 wherein said amplifier includes an automatic level control circuit having a pair of serially coupled capacitors coupled between a source of D.C. operating power and system ground and the junction of said capacitors is coupled to the input of said amplifier and to a current feedback resistor having its terminal remote from said junction coupled to said potentiometer.

16. The circuit as defined in claim 15 and further including an alarm circuit coupled to said switch circuit for receiving control signals therefrom for actuating said alarm in response to the proximity of a person's body capacitance to said sensing element.

17. The circuit as defined in claim 10 and further including an alarm circuit coupled to said switch for providing an alarm signal in response to a transient capacitance change near said sensing element.

* * * * *

UNITED STATES PATENT AND TRADEMARK OFFICE
CERTIFICATE OF CORRECTION

PATENT NO. : 4,831,279

DATED : 5/16/89

INVENTOR(S) : R. Ingraham

It is certified that error appears in the above-identified patent and that said Letters Patent is hereby corrected as shown below:

Column 1, Line 15
    "persons" should be --person's--

Column 2, Line 43
    "resistor 1" should be --resistor 16--

Column 3, Line 21
    "tim" should be --time--

Column 5, Claim 1, Line 22
  "t" should be --to--

Column 5, Claim 1, Line
Before "switch" insert --a--

Column 5, Claim 3, Line 37
    "Claim 1" should be --Claim 2--

Signed and Sealed this

Sixteenth Day of October, 1990

Attest:

HARRY F. MANBECK, JR.

*Attesting Officer*        *Commissioner of Patents and Trademarks*